United States Patent [19]
Sugahara

[11] Patent Number: 6,037,656
[45] Date of Patent: *Mar. 14, 2000

[54] SEMICONDUCTOR INTEGRATED CIRCUIT DEVICE HAVING SHORT SIGNAL PATHS TO TERMINALS AND PROCESS OF FABRICATION THEREOF

[75] Inventor: Kenji Sugahara, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/909,963

[22] Filed: Aug. 12, 1997

[30] Foreign Application Priority Data

Aug. 12, 1996 [JP] Japan .................................. 8-212375

[51] Int. Cl.⁷ .......................... H01L 23/12; H01L 23/053; H01L 23/02; H01L 23/10
[52] U.S. Cl. .......................... 257/697; 257/787; 257/700; 257/678; 257/704; 257/710
[58] Field of Search .................................. 257/697, 787, 257/700, 678, 704, 710

[56] References Cited

U.S. PATENT DOCUMENTS

| | | | |
|---|---|---|---|
| 4,530,002 | 7/1985 | Kanai | 257/697 |
| 4,663,215 | 5/1987 | Dubuisson et al. | 428/209 |
| 5,216,278 | 6/1993 | Lin et al. | 257/688 |
| 5,468,999 | 11/1995 | Lin et al. | 257/784 |
| 5,563,446 | 10/1996 | Chia et al. | 257/704 |
| 5,736,789 | 4/1998 | Moscicki | 257/774 |
| 5,808,873 | 9/1998 | Celaya et al. | 361/760 |

FOREIGN PATENT DOCUMENTS

| | | |
|---|---|---|
| 63-131593 | 6/1988 | Japan . |
| 63-118241 | 7/1988 | Japan . |
| 5-66996 | 9/1993 | Japan . |
| 7-245360 | 9/1995 | Japan . |
| 7-321246 | 12/1995 | Japan . |

*Primary Examiner*—Olik Chaudhuri
*Assistant Examiner*—Steven H. Rao

[57] ABSTRACT

A ball grid array package provides conductive paths between terminals and a semiconductor chip through via-hole plugs formed in a circuit board, and the via-hole plugs are covered with a rigid plate before sealing the semiconductor chip in synthetic resin so as to prevent the via-hole plugs from penetration of the synthetic resin.

2 Claims, 5 Drawing Sheets

6,037,656

SEMICONDUCTOR INTEGRATED CIRCUIT DEVICE HAVING SHORT SIGNAL PATHS TO TERMINALS AND PROCESS OF FABRICATION THEREOF

FIELD OF THE INVENTION

This invention relates to a semiconductor integrated circuit device and, more particularly, to a semiconductor integrated circuit device having short signal paths between a semiconductor chip and terminals and a process of fabrication thereof.

DESCRIPTION OF THE RELATED ART

A large number of circuit components form an integrated circuit on a single semiconductor chip, and the single semiconductor chip is sealed in a package. The integrated circuit communicates with another circuit through conductive pins, and various pin arrangements have been proposed. A quad flat package has the conductive pins arranged along the periphery thereof, and the signal pins are spaced at pitch of 0.65 millimeter in the standard product. Now the pitch is decreased to 0.5 - 0.4 millimeter. The pitch is inversely proportional to the number of conductive pins in the quad flat package, and sets the limit on the number of conductive pins around 400 for the quad flat package. However, current integrated circuits require more than 500 conductive pins, and a ball grid array package can respond to the requirement.

A typical example of the ball grid array package is disclosed in Japanese Patent Publication of Unexamined Application No. 7-321246. The prior art example is improved on the basis of a ball grid array package shown in FIG. 1.

The prior art ball grid array package comprises an insulating board 1 of glass or epoxy resin, and a plurality of via-hole plugs 2 are formed in the insulating substrate 1. The via-hole plugs 2 extend between an upper surface and a lower surface of the insulating substrate 1, and the via-hole plugs 2 provide conductive path between the upper surface and the lower surface.

The prior art ball grid array package further comprises conductive strips 3a/3b/3c and 4a/4b/4c patterned on the upper/lower surfaces of the insulating board 1 and solder balls 5a/5b/5c/5d/5e selectively connected to the conductive strips 4a, 4b and 4c. A semiconductor chip 6 is mounted on the conductive strip 3b, and the conductive strip 3b is connected through the via-hole plugs 2 formed in a central area of the insulating board 1 to the conductive strip 4b serving as a ground line. The conductive strips 3a and 3c are connected through the via-hole plugs 2 formed in the peripheral area of the insulating board 1 to the conductive strips 4a/4b, and bonding wires 7a and 7b extend between bonding pads of the semiconductor chip 6 and the conductive strips 3a/3c.

The prior art ball grid array package further comprises a sealing resin piece 8, and the semiconductor chip 6, the bonding wires 7a/7b and the conductive strips 3a/3b/3c are sealed in the resin piece 8. However, the sealing resin 8 does not cover the conductive strips 3a/3b over the via-hole plugs 2.

The prior art semiconductor integrated circuit device is assembled as follows. First, the semiconductor chip 6 is fixed to the conductive strip 3b, and the bonding pads are connected through the bonding wires 7a/7b to the conductive strips 3a/3b. Finally, the semiconductor chip 6 is sealed in the resin piece 8 by using a transfer molding technique.

The manufacturer uses the entire reverse surface of the insulating substrate 1 for connection between the integrated circuit and another circuit, and provides terminals thereon more than the terminals or the pins of the quad flat package.

Japanese Patent Publication of Unexamined Application No. 321246 proposes to attach a rigid plate member with an opening attached to the upper surface of the resin piece 8 in such a manner that the opening is opposed to the semiconductor chip 6.

Japanese Patent Publication of Unexamined Application No. 7-245360 discloses another semiconductor device using a ball grid array package. A flip chip is assembled with a resin circuit board forming a part of the ball grip array package. The Japanese Patent Publication of Unexamined Application proposes to fill the gap between the flip chip and the resin circuit board with sealing resin through the capillary phenomenon. However, the method disclosed in the Japanese Patent Publication of Unexamined Application is hardly applied to a standard ball grid array package where conductive strips are connected through bonding wires to a semiconductor chip mounted on another conductive strip.

The prior art grid array package shown in FIG. 1 and improvements thereof encounter a problem in large resistance/capacitance/inductance. This is because of the fact that the conductive strips 3a/3b are prolonged due to the location of the via-hole plugs 2. If the conductive strips 3a/3c are connected through via-hole plugs 2 formed in the central area of the insulating board 1 to the conductive strips 4a/4c, the problem is solved. However, the sealing resin 8 tends to penetrate into gaps between the via-hole plugs 2 and the insulating board 1, and spreads over the conductive strips 4a/4b/4c. This results in deterioration of the electrical connections through the via-hole plugs 2.

SUMMARY OF THE INVENTION

It is therefore an important object of the present invention to provide a semiconductor device, which provides improved conductive paths without deterioration of electrical connections.

It is also an important object of the present invention to provide a process of fabricating the semiconductor device.

To accomplish the object, the present invention proposes to cover via-hole plugs with a plate.

In accordance with one aspect of the present invention, there is provided a semiconductor device comprising a semiconductor chip where an electric circuit is fabricated, a package for accommodating the semiconductor chip including an insulating board having a first major surface and a second major surface over which the semiconductor chip is provided, vertical interconnections formed in the insulating board and exposed to the first major surface and the second major surface, terminals formed on the first major surface so as to communicate with an external electric component, conductive means for providing electrical connection between the terminals and the electric circuit through the vertical interconnections, a plate member provided on the second major surface so as to cover the via-hole plugs and a sealing member formed over the second major surface so as to cover the plate member and the semiconductor chip.

In accordance with another aspect of the present invention, there is provided a process of fabricating a semiconductor device, comprising the steps of: preparing a circuit board including an insulating board having a first major surface and a second major surface, conductive means formed on the first and second major surfaces, terminals connected to the conductive means on the first major surface and vertical interconnections formed in the insulating board for connecting the conductive means on the first major surface to the conductive means on the second major surface; mounting the semiconductor chip over the second major surface; electrically connecting the semiconductor chip to the conductive means on the second major surface so as to provide electrical paths between the semiconductor chip and the terminals; fixing a plate member to the second major surface so as to cover the vertical interconnection therewith; and sealing at least semiconductor chip and conductive means on the second major surface in resin.

BRIEF DESCRIPTION OF THE DRAWINGS

The features and advantages of the semiconductor device and the process will be more clearly understood from the following description taken in conjunction with the accompanying drawings in which.

DESCRIPTION OF THE PREFERRED EMBODIMENTS

First Embodiment

Figure 1:
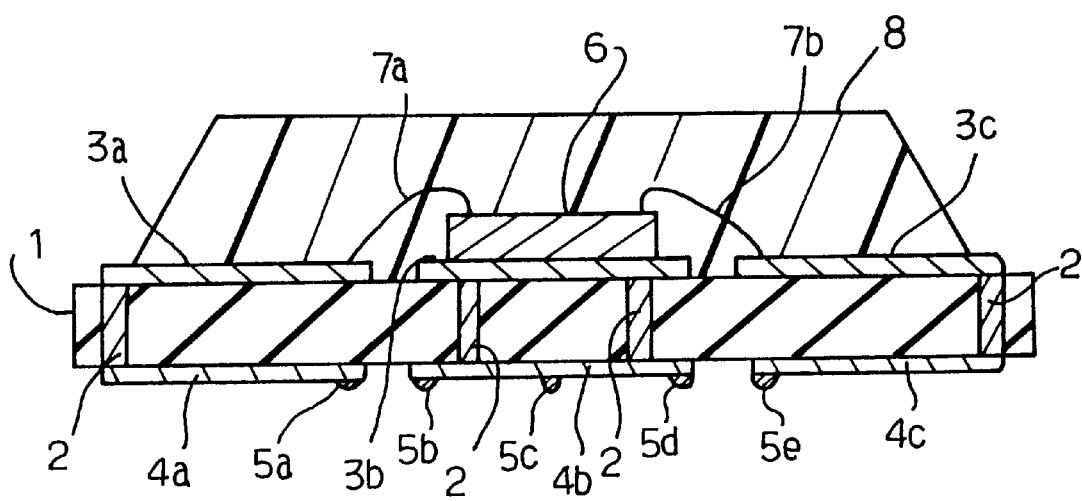
FIG. 1 is a cross sectional view showing the structure of the prior art ball grid array package.
Figure 2:
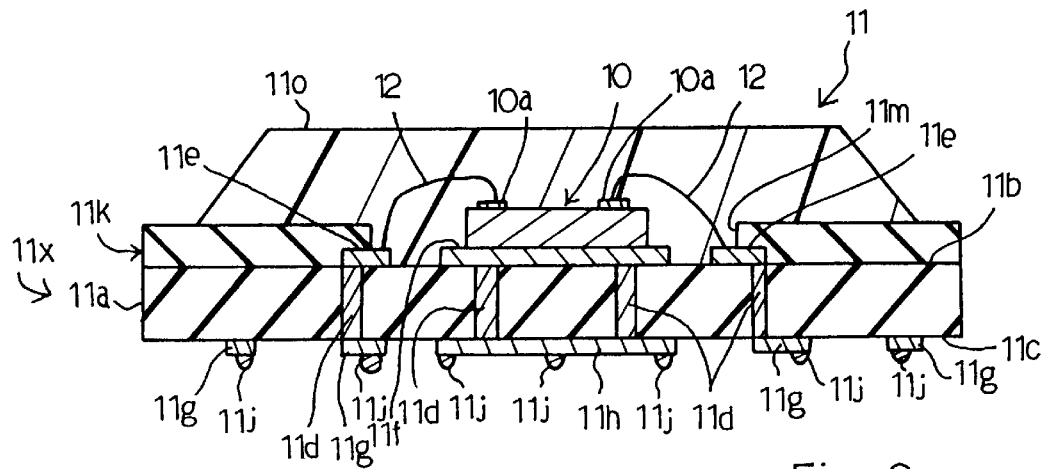
FIG. 2 is a cross sectional view showing the structure of a semiconductor device according to the present invention.

Referring to FIG. 2 of the drawings, a semiconductor device embodying the present invention largely comprises a semiconductor chip 10, a ball grid array package 11 and bonding wires 12. A large number of circuit components are fabricated together on the semiconductor chip 10, and form an integrated circuit.

The ball grid array package 11 includes an insulating board 11a of insulating material such as, for example, glass or epoxy resin, and has a first major surface 11b and a second major surface 11c on the opposite sides thereof. Via-hole plugs 11d are formed in the insulating board 11a, and are exposed to a central area of the first major surface 11b and a central area of the second major surface 11c at both ends thereof.

The ball grid array package 11 further includes conductive strips 11e/11f and 11g/11h patterned on the first major surface 11b and the second major surface 11c and solder balls 11j. The semiconductor chip 10 is adhered to the conductive strip 11f by means of conductive paste, and the other conductive strips 11e are connected through the bonding wires 12 to bonding pads 10a of the semiconductor chip 10. The bonding pads 10a form parts of the integrated circuit. The conductive strips 11e/11f are held in contact with the via-hole plugs 11d, and the other conductive strips 11g/11h are also held in contact with the via-hole plugs 11d. For this reason, the integrated circuit is electrically connected through the bonding wires 12, the conductive strips 11e, the via-hole plugs 11d and the conductive strips 11g to the solder balls 11j. The conductive strip 11h serves as a ground line.

The solder balls 11j are, by way of example, bonded to a conductive pattern on a rigid circuit board (not shown), and an external circuit or device communicates with the integrated circuit through the solder balls 11j. Thus, the solder balls 11j serve as terminals, and the conductive strips 11e/11g and the bonding wires 12 as a whole constitute conductive means.

The via-hole plugs 11d are formed in the central area of the insulating board 11a, and the signal paths between the solder balls 11j and the integrated circuit are shorter than those of the prior art ball grid array package. The insulating board 11a, the conductive strips 11e/11f/11g/11h, the via-hole plugs 11d and the solder balls 11j as a whole constitute a circuit board 11x.

Figure 3:
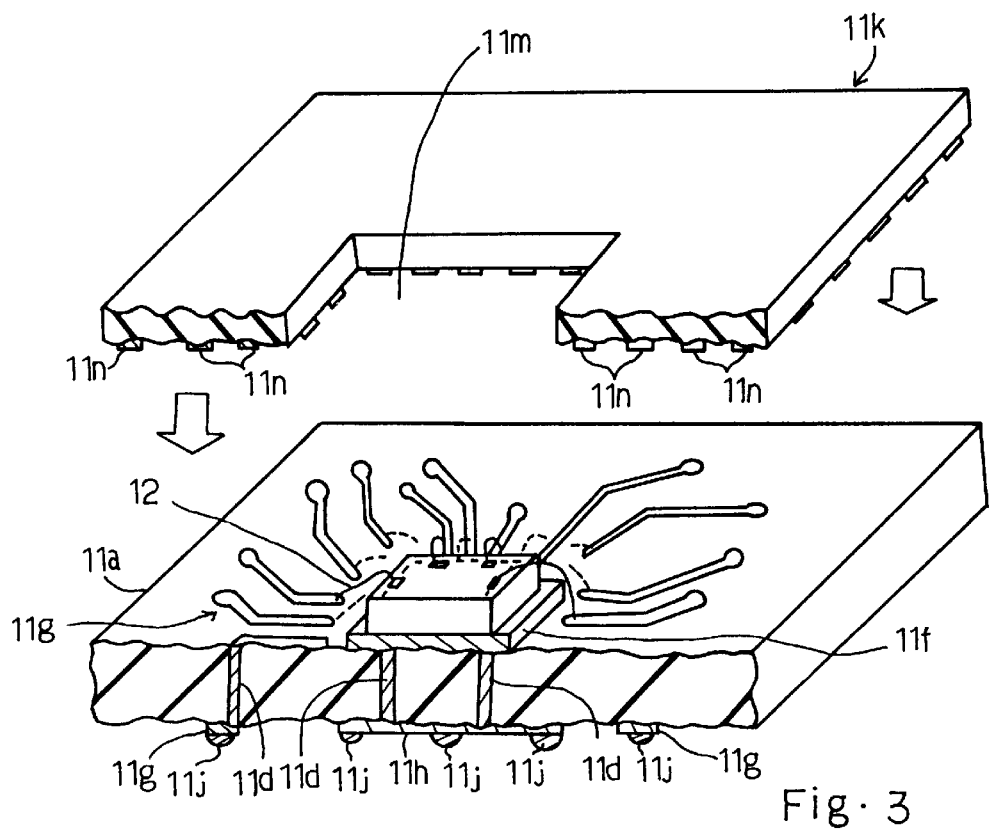
FIG. 3 is a perspective view showing a plate over via-hole plugs incorporated in the semiconductor device.

The ball grid array package 11 further includes a cover member 11k, and the cover member 11k is formed of insulating material. In this instance, the insulating material for the cover member 11k is identical with the insulating material of the board 11a. The cover member 11k has a rectangular opening 11m wider than the semiconductor chip 10; however, the cover member 11k does not expose the via-hole plugs 11d between the conductive strips 11e and 11g to the opening 11m. The cover member 11k is fixed to the insulating board 11a by means of thermosetting adhesive compound. The adhesive compound is thermally set during the transfer molding. In this instance, the thermosetting adhesive compound is polyimide. In this instance, the thermosetting adhesive compound 11n is applied to the cover member 11k prior to the assemblage with the insulating board 11a as shown in FIG. 3.

The ball grid array package 11 further includes a sealing resin piece 11o. The semiconductor chip 10, the bonding wires 12 and the inner peripheral area of the cover member 11k are covered with the resin piece 11o. Even though the sealing resin 11o is provided over the via-hole plugs 11d, the cover member 11k prevents the via-hole plugs 11d from the sealing resin 11o, and the electrical connection through the via-hole plugs 11d are never deteriorated.

Figure 4A:
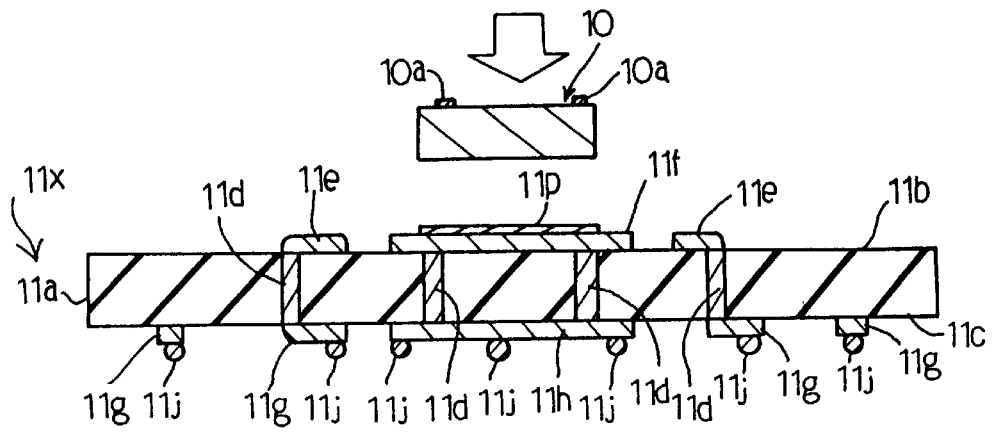
FIGS. 4A to 4D are cross sectional views showing essential steps of a process of fabricating the semiconductor device.

The semiconductor device is fabricated as shown in FIGS. 4A to 4D. First, the circuit board 11x is prepared, and conductive paste 11p is supplied to the upper surface of the conductive strip 11f. The semiconductor chip 10 is pressed against the conductive strip 11f as shown in FIG. 4A, and the conductive paste 11p bonds the semiconductor chip 10 to the conductive strip 11f.

Figure 4B:
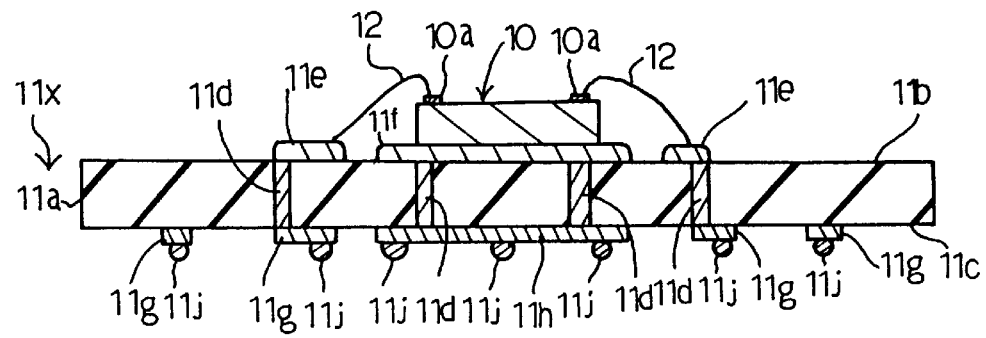

Subsequently, the bonding wires 12 are connected at the leading ends to the bonding pads 10a and at the other ends to the conductive strips 11e by using a wire bonding machine (not shown). As a result, the integrated circuit is electrically connected through the bonding wires 12 to the conductive strips 11e as shown in FIG. 4B.

Figure 4C:
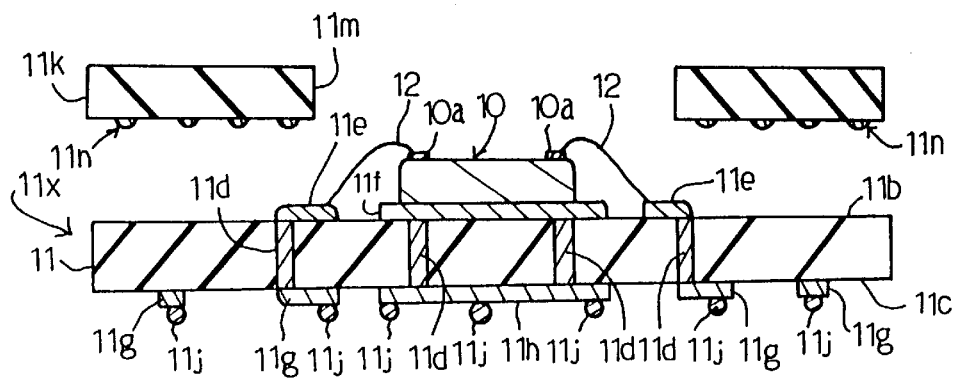

Subsequently, the thermosetting adhesive compound 11n is supplied to the reverse surface of the cover member 11k, and is opposed to the major surface 11b. The cover member 11k is aligned with the circuit board 11x in such a manner that the semiconductor chip 10 is exposed to the opening 11m as shown in FIG. 4C. The cover member 11k is pressed against the circuit board 11k.

Figure 4D:
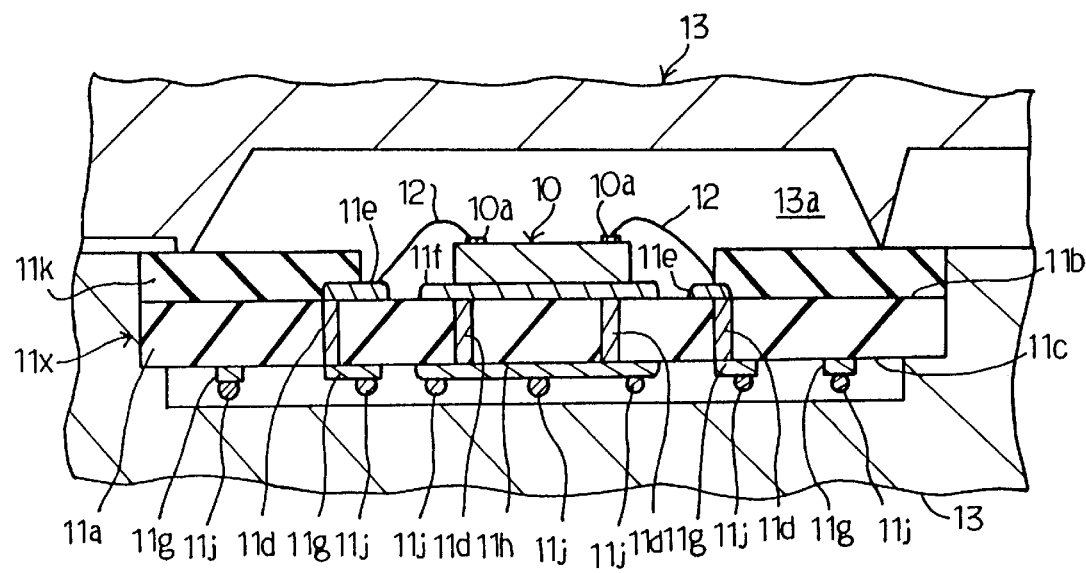

The semiconductor chip 10 mounted on the circuit board 11x is accommodated in a transfer molding die unit 13 together with the cover member 11k as shown in FIG. 4D. Molten synthetic resin is injected into the inner space 13a of the transfer molding die unit 13, and the semiconductor chip 10, the cover member 11k and the bonding wires 12 are sealed in the resin 11o as shown in FIG. 2. While the molten resin is filling the inner space 13a, the thermosetting adhesive compound fixes the cover member 11k to the circuit board 11x.

The cover member 11k does not allow the molten resin to penetrate into the gap between the via-hole plugs 11d and the insulating board 11a, and prevents the electrical connections between the integrated circuit and the solder balls 11j.

As will be appreciated from the foregoing description, the cover member 11k does not allow the molten resin to penetrate into the gaps between the via-hole plugs 11d and the insulating board 11a. For this reason, the manufacturer locates the via-hole plugs 11d around the conductive strip 11f for the semiconductor chip 10, and the via-hole plugs 11d around the semiconductor chip 10 shortens the signal path between the electric circuit and the solder balls 11j. This results in reduction of undesirable parasitic resistance/capacitance/inductance, and the ball grid array package according to the present invention improves the frequency characteristics of the integrated circuit.

Second Embodiment

Figure 5:
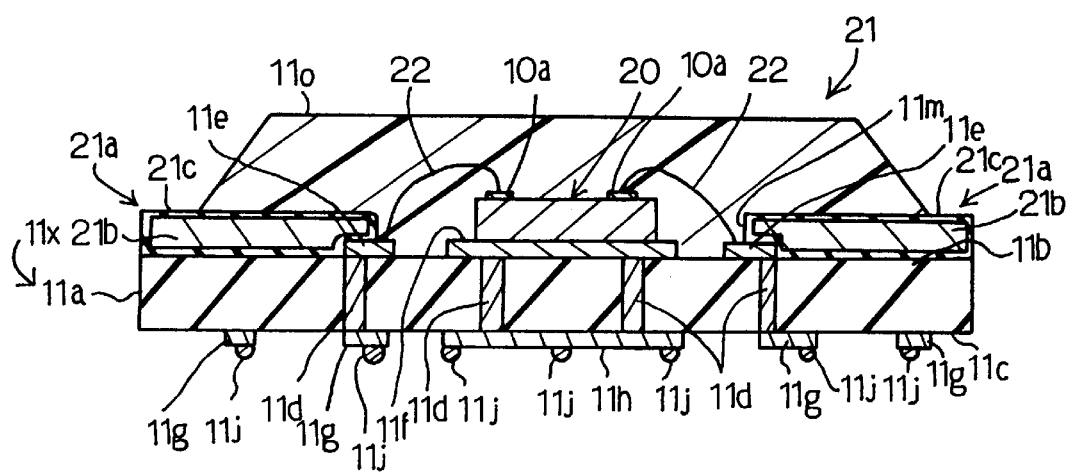
FIG. 5 is a cross sectional view showing the structure of another semiconductor device according to the present invention.

Turning to FIG. 5 of the drawings, another semiconductor device embodying the present invention also largely comprises a semiconductor chip 20, a ball grid array package 21 and bonding wires 22. The semiconductor device implementing the second embodiment is similar to the first embodiment except for a cover member 21a. For this reason, the other component members of the ball grid array package 21 are labeled with the same references designating corresponding members of the first embodiment without detailed description.

The cover member 21a is formed from a metal plate 21b coated with an insulating film 21c. In this instance, the metal plate 21b is formed of aluminum, and the insulating film 21c is formed of alumite. The cover member 21a is desirable, because the metallic cover member 21a radiates heat generated by the semiconductor chip 20. In fact, the metallic cover member 21a enhances the heat radiation capability at 30 to 40 percent with respect to the prior art ball grid array package.

Although particular embodiments of the present invention have been shown and described, it will be obvious to those skilled in the art that various changes and modifications may be made without departing from the spirit and scope of the present invention.

For example, the cover member is effective against any kind of resin package in so far as a via-hole plug connects conductive layers on both major surfaces.

What is claimed is:

1. A semiconductor device comprising:

a semiconductor chip where an electric circuit is fabricated;

a package for accommodating said semiconductor chip including an insulating board having a first major surface and a second major surface over which said semiconductor chip is provided, vertical interconnections formed in said insulating board and exposed to said first major surface and said second major surface, terminals formed on said first major surface so as to communicate with an external electric component, conductive means for providing electrical connection between said terminals and said electric circuit through said vertical interconnections, a plate member provided on said second major surface so as to cover said vertical interconnections, and a sealing member formed over said second major surface so as to cover said plate member and said semiconductor chip, said plate member being a metal plate coated with an insulating film.

2. The semiconductor device as set forth in claim 1, in which said metal plate and said insulating film are formed of aluminum and alumite, respectively.

* * * * *